United States Patent

Stilke et al.

(10) Patent No.: US 6,667,886 B2
(45) Date of Patent: Dec. 23, 2003

(54) COOLING BODY-CONDUCTOR STRIPS ARRANGEMENT

(75) Inventors: Henning Stilke, Leeste (DE); Thomas Bilsing, Boennigheim (DE)

(73) Assignee: Robert Bosch GmbH, Stuttgart (DE)

( * ) Notice: Subject to any disclaimer, the term of this patent is extended or adjusted under 35 U.S.C. 154(b) by 111 days.

(21) Appl. No.: 10/035,671

(22) Filed: Nov. 9, 2001

(65) Prior Publication Data

US 2002/0079090 A1 Jun. 27, 2002

(30) Foreign Application Priority Data

Nov. 9, 2000 (DE) ..................................... 200 19 053 U

(51) Int. Cl.⁷ ................................................ H05K 7/20
(52) U.S. Cl. ...................... 361/705; 174/52.2; 174/252; 257/796; 361/707
(58) Field of Search .............................. 174/252, 16.3, 174/52.2; 165/80.3, 185; 439/485; 257/796, 675, 222; 363/141; 361/703, 704, 705–711, 715, 723

(56) References Cited

U.S. PATENT DOCUMENTS

| 3,783,345 | A | * | 1/1974 | Taylor et al. ................ 257/786 |
| 4,367,523 | A | * | 1/1983 | Urba ........................... 363/141 |
| 4,879,630 | A | * | 11/1989 | Boucard et al. ............ 361/722 |
| 5,422,788 | A | * | 6/1995 | Heinen et al. |
| 6,355,985 | B1 | * | 3/2002 | Brand |
| 6,506,629 | B1 | * | 1/2003 | Kinsman et al. ............ 438/122 |

* cited by examiner

Primary Examiner—Gerald Tolin
(74) Attorney, Agent, or Firm—Michael J. Striker

(57) ABSTRACT

A cooling body-conductor strips arrangement for electrical devices has a cooling body for withdrawing heat to a surrounding area, a base plate composed of an electrically insulating material and provided with a first conductor strip unit which is embedded in the material of the base plate, the base plate being flatly connected with the cooling body.

4 Claims, 1 Drawing Sheet

COOLING BODY-CONDUCTOR STRIPS ARRANGEMENT

BACKGROUND OF THE INVENTION

The present invention relates to a cooling body-conductor strips arrangement for electrical devices.

During the manufacture of cooling body-conductor strips arrangements frequently base plates with conductor strips located on them are placed on a cooling body and subsequently injection molded around them. Hollow spaces remain located along the contact surface between the base plate and the cooling body. During later operation a penetration of moisture as well as the production of leakage currents can be caused.

SUMMARY OF THE INVENTION

Accordingly, it is an object of the present invention to provide a cooling body-conductor strips arrangement which avoids the disadvantages of the prior art.

More particularly, it is an object of the present invention to provide a cooling body-conductor strips arrangement which operates reliably and as well as possible without errors.

In keeping with these objects and with others which will become apparent hereinafter, one feature of present invention resides, briefly stated in a cooling body-conductor strips arrangement which has a cooling body for withdrawing heat to a surrounding area; a base plate composed of an electrically insulating material and provided with a first conductor strip unit which is embedded in said material of said base plate, said base plate being flatly connected with said cooling body.

In the cooling body-conductor strips arrangement the base plate and the cooling body are connected with one another flatly so that, no air inclusions remain along the contact surface.

In accordance with another feature of present invention the base plate is glued with the cooling body. In accordance with still another feature of the present invention, the cooling body and the base plate are connected with one another so that along the contact surface no gas bubbles are located.

Still another feature of the present invention is that a second conductor strip unit can be arranged on the base plate.

At least a part of the cooling body, the base plate and the second conductor strip unit can be covered with a covering material by injection molding.

The material of the base plate and the material of the covering can be connected with one another, in particular they can be connected inseparably with one another.

Finally, the material of the base plate and/or the material of the covering can be composed of a synthetic plastic which is capable of being injection molded.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
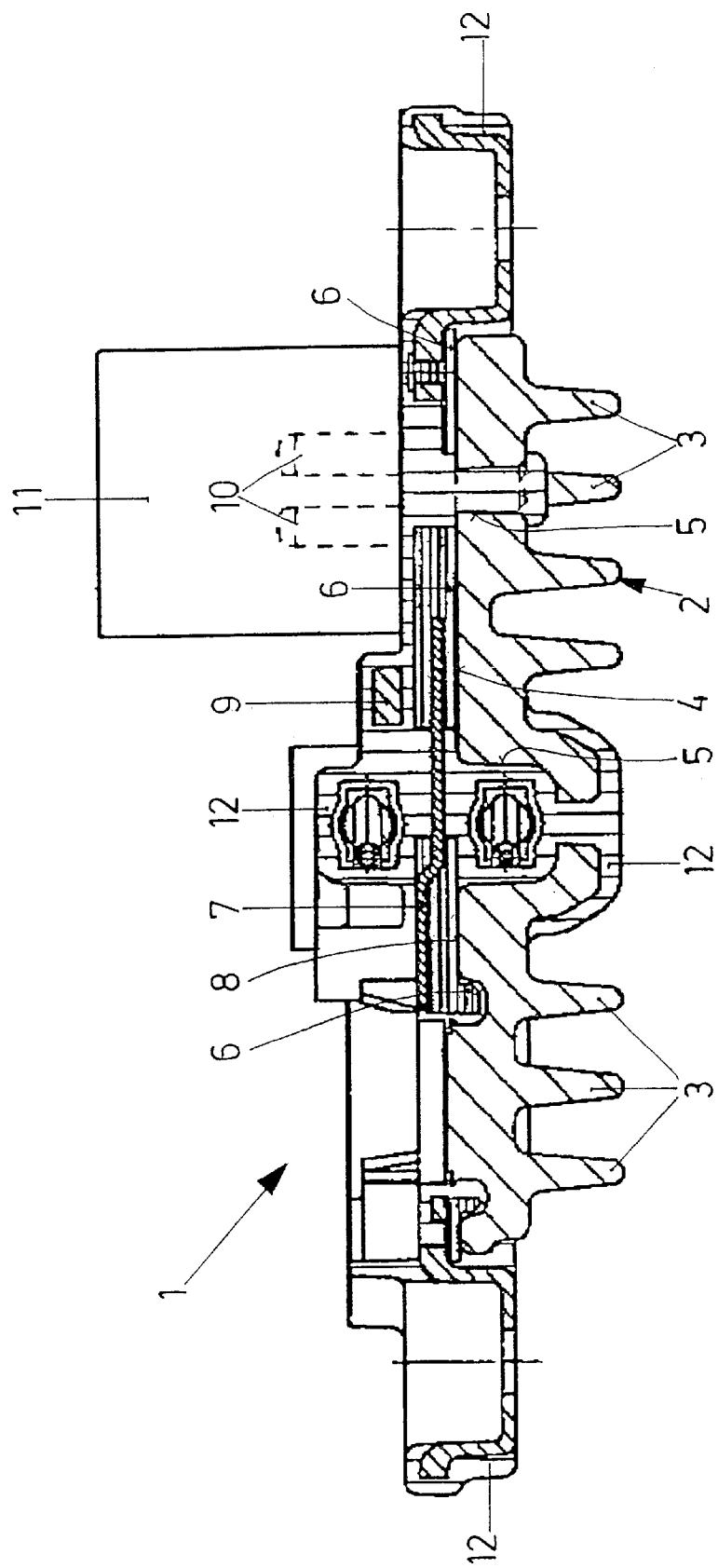
FIG. 1 is a view showing a cross-section of a cooling body-conductor strips arrangement in accordance with the present invention.

A cooling body-conductor strips arrangement is identified with reference numeral 1. It is provided for a biopolar voltage controller of a generator and has a cooling body identified with reference numeral 2. The cooling body 2 is provided with downwardly projecting cooling plates 3.

The cooling body at its upper side has a substantially flat abutment surface 4. This surface is interrupted by receptacles 5. A base plate 6 is arranged on the cooling body 2. The base plate 6 is composed of a synthetic plastic matrix which in turn is composed of a base plate material, which is an electrically insulating material. The base plate 6 is consequently composed of the base plate material.

A unit of conductor strips 7 or current rails is embedded in the synthetic plastic matrix of the base plate 6. The base plate 6 forms a so-called pre-molded article which receives the conductor strips 7, so that during the mounting it can be simply placed on the cooling body 2.

The base plate 6 is glued along its whole lower side base with the abutment surface 4 of the cooling body 7 over a surface which is as large as possible. The glueing is formed so that, along the whole surface between the lower side 8 and the abutment surface 4 no gas bubbles are located.

A second unit of conductor strips 9 is arranged on the base plate 6. It is electrically insulated by the material of the base plate from the conductor strips 7. Furthermore, the base plate 6 is provided with projecting plug pins 10 which are surrounded by a plug socket 11.

The base plate 6, the conductor strips 9, as well as parts of the cooling body 2 are covered with a covering material composed of a synthetic plastic and applied by injection molding. It forms a cover layer 12. In this way, the arrangement 1 is electrically isolated and simultaneously is no longer sensitive to moisture from outside. The material of the cover layer and the material of the base plate can be composed of the same synthetic plastic. They are connected with one another more or less, depending on the synthetic plastic.

The manufacturing process of the cooling body-conductor strips arrangement 1 is briefly described herein below.

First, the base plate 6 is produced by injection molding of the conductor strips 7 on the material of the base plate. Then the conductor strips 9 are arranged on the base plate 6. Thereafter, the base plate 6 is glued flatly and without air bubbles on the cooling body 2. After this, the whole arrangement is covered with a covering material by injection molding. Due to the flat adhesive (glue) connection between the base plate 6 and the cooling body 2, no air bubbles are located inside the cover layer 12. Therefore a substantially homogenous total body is produced. Leakage currents and electrolysis are prevented because the hollow spaces are avoided.

It will be understood that each of the elements described above, or two or more together, may also find a useful application in other types of constructions differing from the types described above.

While the invention has been illustrated and described as embodied in cooling body-strip conductors arrangement, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

What is claimed is:

1. A cooling body-conductor strips arrangement for electrical devices, comprising:

a cooling body for withdrawing heat to a surrounding area;

a base plate composed of an electrically insulating material and provided with a first conductor strip unit which is embedded in said material of said base plate, said base plate being flatly connected with said cooling body;

a second conductor strip unit being arranged on said base plate, wherein at least a part of said cooling body, said base plate, and said second conductor strip unit are covered with an electrically insulating covering material by injection molding; and wherein said covering material and said material of said base elate are connected inseparably with one another.

2. A cooling body-conductor strips arrangement as defined in claim 1, wherein said base plate is glued with said cooling body.

3. A cooling body-conductor strips arrangement as defined in claim 1, wherein said base plate is connected flatly with said cooling body along a contact surface which is such that between said cooling body and said base plate no gas bubbles are located.

4. A cooling body-conductor strips arrangement as defined in claim 1, wherein one of said materials selected from the group consisting of said material of said base plate, said covering material, and both is a synthetic plastic which is injection moldable.

* * * * *